United States Patent [19]

Liu

[11] Patent Number: 5,796,670
[45] Date of Patent: Aug. 18, 1998

[54] NONVOLATILE DYNAMIC RANDOM ACCESS MEMORY DEVICE

[75] Inventor: Kwo-Jen Liu, San Jose, Calif.

[73] Assignee: Ramax Semiconductor, Inc., San Jose, Calif.

[21] Appl. No.: 745,101

[22] Filed: Nov. 7, 1996

[51] Int. Cl.$^6$ .................................................. G11C 13/00
[52] U.S. Cl. ............................................ 365/228; 365/149
[58] Field of Search .................................. 365/149, 150, 365/228

[56] References Cited

U.S. PATENT DOCUMENTS

| | | | |
|---|---|---|---|
| 3,771,148 | 11/1973 | Aneshansley | 365/228 |
| 4,855,955 | 8/1989 | Cioaca | 365/185 |
| 5,202,850 | 4/1993 | Jenq | 365/185 |
| 5,373,465 | 12/1994 | Chin et al. | 365/185 |
| 5,418,752 | 5/1995 | Harari et al. | 365/218 |
| 5,482,881 | 1/1996 | Chin et al. | 437/43 |

*Primary Examiner*—Terrell W. Fears
*Attorney, Agent, or Firm*—Jeffrey P. Aiello; Aiello Patent Prosecution

[57] ABSTRACT

A nonvolatile memory cell for a random access memory device is provided. The invented memory cells are similar in configuration to the memory cells of known DRAM devices, so that DRAM devices embodying the invented cells may replace existing DRAM devices. The invented nonvolatile cell also affords a memory device that has low cost of manufacture, high data storage capacity, and low power consumption. Each memory cell includes a floating layer of polysilicon that is interposed between a reference voltage source and a node polysilicon. The floating polysilicon provides nonvolatile storage of data previously stored on the node polysilicon. An electron charge stored on the node polysilicon is transferred to the floating polysilicon, using known electron tunneling methods, before power to the device is removed, so that the data is not lost. When power is reapplied to the device, the data is transferred back to the node polysilicon from the floating polysilicon, so that the data can be accessed as if the data were stored in a conventional DRAM device. With the invented memory cells, data is accessed and manipulated substantially faster than known nonvolatile memory devices. Additionally, an insulating oxide layer is interposed between the floating polysilicon and the reference voltage source, for reducing leakage current from the floating polysilicon to the reference voltage source. This enhances the ability of the floating polysilicon to retain data thereon.

20 Claims, 2 Drawing Sheets

NONVOLATILE DYNAMIC RANDOM ACCESS MEMORY DEVICE

BACKGROUND OF THE INVENTION

1. Field of the Invention

The present invention relates generally to semiconductor memory devices, and more particularly, to a nonvolatile dynamic random access memory device.

2. Description of Related Art

There are essentially two types of data memory devices used in computers today, "Nonvolatile" and "Volatile". Common nonvolatile memory devices include well known Read Only Memory (ROM) devices that include EPROM (erasable programmable ROM) devices, EEPROM (electrically erasable programmable ROM) devices, Flash EEPROM devices, and magnetic tape data storage devices, such as well known hard disk drives. These nonvolatile memory devices maintain the data stored therein, even when power to the device is removed, thus their nonvolatility.

Volatile memory devices include Dynamic Random Access Memory (DRAM) chips and Static Random Access Memory (SRAM) devices. RAM devices in the prior art have been used for temporary data storage, such as during data manipulation, since writing data into, and reading data out of, the device is performed quickly and easily. However, a disadvantage of these devices, is that they require the constant application of power, such as in the form of a data refresh signal, to refresh and maintain data stored in the memory cells of the chip. Once power supplied to the device is interrupted, the data stored in the memory cells of the chip is lost.

Of the nonvolatile memory devices EEPROMs and Flash EEPROMs are emerging as a preferable means for data storage. These devices are somewhat rugged, they do not have the moving components of hard disk drives, and they have relatively low power consumption. One such Flash EEPROM device is disclosed in U.S. Pat. No. 5,373,465, to Chen et al. The disclosed flash EEPROM requires a 5 volt external source to effect Fowler-Nordheim tunneling during both program and erase modes of the device. Properties of dielectric layers between a floating gate and a control gate, and between the floating gate and a drain region differ to facilitate programming and erasing of the floating gate. An on-device voltage multiplier is used to convert the external 5 volt DC signal to a high voltage of approximately 20 to 30 volts.

U.S. Pat. No. 5,418,752, to Harari et al. discloses a system of flash EEPROM memory chips that serve as a unitary nonvolatile memory means, similar to a memory provided by a hard disk drive. The disclosed system enables any combinations of flash sections to be erased together and to de-select selected sectors during the erase operation. The system also provides the ability to automatically remap and replace defective cells with substitute cells, upon the detection of defective cells.

U.S. Pat. No. 4,855,955, to Cioaca, is directed to a three transistor high endurance EEPROM cell that comprises two floating gate MOS transistors connected in series with a select transistor. A plurality of such memory cells may be connected together as a byte, and may be placed in an array, with the gates of the select transistors connected together. A word line signal is provided to drive the gates of the select transistors and to drive the gates of two sense line byte select transistors. The word line signal enables the sense line signals to appear on only the gates of the memory cell floating gate transistor of the selected byte.

Another nonvolatile semiconductor memory device is disclosed in U.S. Pat. No. 5,202,850, to Jenq, which is directed to a single transistor nonvolatile electrically alterable semiconductor memory device with a re-crystallized floating gate. The device comprises a semiconductor substrate having a first conductivity type. Source and drain regions are defined in the substrate, with a channel region therebetween. An electrically conductive, re-crystallized floating gate is disposed over a first insulating layer that is disposed over the source and drain regions. The floating gate extends over a portion of the channel region and over a portion of the drain region to maximize capacitive coupling therewith.

A second insulating layer has a top wall portion immediately adjacent to the floating gate and has a thickness that permits Fowler-Nordheim tunneling of charges therethrough. An electrically conductive control gate has a first section that is over the first insulating layer and immediately adjacent to the side wall portion of the second insulating layer, and a second portion. The first portion further extends over a portion of the channel region and over the source region. The second section is disposed over the top wall portion of the second insulating layer to minimize capacitive coupling with the floating gate.

A method for forming a dual thickness dielectric floating gate memory cell is disclosed in U.S. Pat. No. 5,324,676, to Guterman. The disclosed method is used to fabricate an integrated circuit device having first and second conducting layers, with the first layer having a shape that enhances field emission tunneling off of the surface thereof, and a dual thickness dielectric layer that separates the conducting layers. When a potential difference is applied between the conducting layers, field emission tunneling occurs primarily through the thinner portion of the dielectric layer.

However, an inherent disadvantage of EEPROM and Flash EEPROM devices is that they must be programmed to store data therein and erased for removing data therefrom. These operations are performed by applying a substantial voltage, usually greater than 20 volts, to the memory cells thereof, causing stress to the device. Thus, there is a finite number of read and write operations that the device can endure, before the device is rendered unreliable. Further, since a substantial voltage must be applied to the device to perform the desired operation, EEPROMs and Flash EEPROMs are noticeably slower than RAM devices when performing read or write data operations.

It therefore would be advantageous to provide a semiconductor memory device that combines the advantages of volatile memory devices, such as high memory capacity, simple memory cell structure, and fast data access, and the nonvolatility of flash EEPROM and EEPROM devices.

OBJECTS OF THE INVENTION

It is therefore an object of the present invention to provide a memory cell for a random access memory device;

It is another object of the present invention to provide a nonvolatile memory cell of a simple structure for providing a random access memory device having high memory capacity;

It is a further object of the present invention to provide a nonvolatile random access memory device with data access speeds substantially faster than prior art nonvolatile data storage means such as EEPROM and Flash EEPROM devices;

It is yet another object of the present invention to provide a nonvolatile random access memory device with data access speeds substantially similar to known random access memory devices;

It is a still further object of the present invention to provide a nonvolatile memory cell for a random access memory devices that would enable portability of the devices; and It is another object of the present invention to provide a nonvolatile memory cell for a random access memory device where data is converted between volatile and nonvolatile states without causing stress to the device.

SUMMARY OF THE INVENTION

These and other objects and advantages of the present invention are achieved by providing a nonvolatile memory cell for a random access memory device, such as a dynamic random access memory (DRAM) device. The memory cells of the present invention are suitably configured to supplant the memory cells of known DRAM devices. Schematically, each memory cell of the invention comprises a select transistor having its gate coupled a word line input of the array. The transistor has either its source or drain, depending upon voltage level, coupled to a sense amplifier via a bitline connection(VBIT) of its memory cell array. The remaining one of the source and drain is connected to a data access capacitor, as is known in the prior art.

However, in the memory cells of the present invention, the data access capacitor is coupled in series to a novel, nonvolatile data storage capacitor that is coupled to a reference voltage source ($V_{REF}$) The novel cell structure of the nonvolatile memory cell of the present invention affords a memory device that has a relatively low cost of manufacture, substantially high data storage capacity, and low power consumption.

In the invented memory cell, the nonvolatile data storage capacitor comprises a floating layer of polysilicon that is interposed between a plate layer of polysilicon comprising the reference voltage source ($V_{REF}$), and a node polysilicon layer comprising the data access capacitor. Particularly, a charge of electrons, indicative of data, that is stored on the access capacitor, is transferred to the data storage capacitor, before power to the device is removed. Therefore, data stored on the data storage capacitor in each of the memory cells of the present invention is not lost when power is removed from the device.

When power is reapplied to a DRAM device embodying the memory cells of the present invention, any charge stored on the nonvolatile data storage capacitor, the floating layer of polysilicon, is transferred back to the access capacitor. Therefore, data stored in the memory cells of the present invention is restored to the data access capacitor and is not lost when power is reapplied to the device. Once the data is transferred to the data access capacitor, the data is then accessed as if the it is stored in a memory cell of a conventional DRAM device, with access speeds equivalent thereto. Data is thus accessed and manipulated substantially faster than known nonvolatile memory chips, such as EEPROM's and Flash EEPROM's. Further, the structure of the invented memory cells, enables a number of previously volatile random access memory devices to be portable, without losing the data stored therein. Additionally, the cells of the present invention provide a DRAM device with known RAM device data access speed features, such as static column and fast page modes, for example.

In the preferred embodiment of the nonvolatile semiconductor memory device of the present invention, each memory cell includes a thin tunneling oxide region that is interposed between a node polysilicon layer and the floating layer of polysilicon. The tunneling oxide region preferably has a thickness that permits transfer of electrons from the node polysilicon to the floating polysilicon using known methods, such as Fowler-Nordheim tunneling or hot electron injection. Additionally, an insulating oxide layer is interposed between the floating polysilicon and the reference voltage source ($V_{REF}$), a plate polysilicon layer, for reducing leakage current from the storage capacitor to the reference voltage source $V_{REF}$. This enhances the storage capacitor's ability to retain data thereon.

In the preferred embodiment, volatile data, data that is stored on the data access capacitor, is converted to nonvolatile data, data that is stored on the storage capacitor, by a program procedure. The program procedure comprises first activating a word line of the memory cell containing the data. The word line is activated for activating the select transistor of each memory cell of a memory cell array word line. Secondly, a sense amplifier coupled to the select transistor via the bitline ($V_{BIT}$), will either electronically ground $V_{BIT}$, or force $V_{BIT}$ to a voltage level equivalent to the supply voltage level ($V_{cc}$), depending upon the value, sensed by the amplifier.

Next, a high voltage, less than 20 volts DC, and preferably ranging from approximately 10 to 15 volts DC for example, is applied to $V_{REF}$ to induce Fowler-Nordheim electron tunneling of electrons from the node polysilicon layer of the transistor (access capacitor), to the floating layer of polysilicon (storage capacitor). Thus, the lower than prior art high voltage level of approximately 10 to 15 volts, enables electron tunneling without causing stress to a DRAM device embodying the present invention.

When $V_{BIT}$ is determined to be at a zero voltage level ($V_{BIT}=0$), by the sense amplifier, electron tunneling occurs from the node polysilicon to the floating polysilicon. After the electrons tunnel to the storage capacitor, the word line is deactivated, with the storage capacitor retaining the charge of electrons thereon to indicate data is stored in the storage capacitor, thus completing programming of the device. The layer of insulating oxide between the floating polysilicon and plate polysilicon aids with maintaining the charge on the floating polysilicon.

If the sense amplifier determines, as previously discussed, that $V_{BIT}$ is substantially equivalent to the supply voltage level ($V_{BIT}=V_{cc}$), then electron tunneling does not occur, due to the positive voltage applied to $V_{REF}$. Thus, after the word line is deactivated no electrons are stored on the storage capacitor.

Nonvolatile data, data that is stored on the storage capacitor, is converted to volatile data, data that is stored on the access capacitor, by a data restore procedure. In the data restore procedure, power is first reapplied to the device. Then word line of the memory cell array containing the data is activated for activating the select transistor of each memory cell thereof The gate region and node polysilicon of the transistor are then electronically grounded. Next, the word line is deactivated by the sense amplifier and a high negative voltage, again ranging from approximately −10 to −15 VDC to prevent stress to the memory cells and device, is applied to the plate polysilicon $V_{REF}$. The charge of electrons stored on the floating polysilicon layer tunnel through the tunneling regions of the tunneling oxide to the node polysilicon, for storing the data thereon and complete the data restore procedure. The charge of electrons stored on the node poly or data access capacitor, indicative of data, is now available using access method equivalent to known DRAM devices.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, in which:

DESCRIPTION OF THE PREFERRED EMBODIMENTS

The following description is provided to enable any person skilled in the art to make and use the invention and sets forth the best modes presently contemplated by the inventor of carrying out the invention. Various modifications, however, will remain readily apparent to those skilled in the art, since the generic principles of the present invention have been defined herein, to provide a nonvolatile memory cell for a random access memory device on a production basis.

Figure 1:
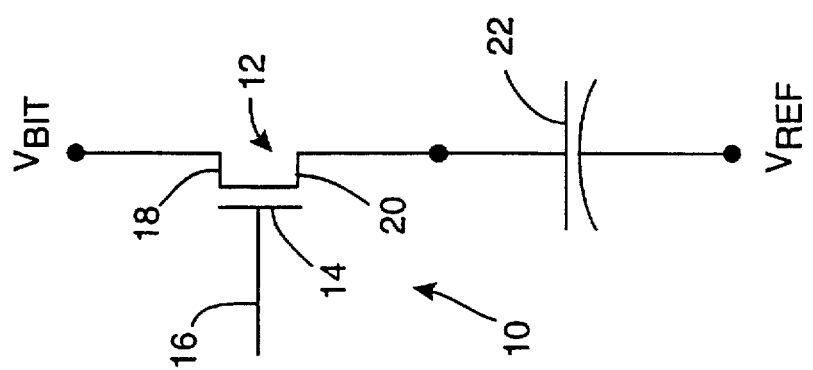
FIG. 1 is a schematic view showing a memory cell of a prior art DRAM device.

Referring now to FIG. 1 of the drawings, there is shown a memory cell 10 of a prior art random access memory device, such as a dynamic random access memory (DRAM) device. It is well known that these DRAM devices comprises plurality of arrays of such memory cells 10. The memory cell 10 comprises a single transistor 12, known as the select transistor, to provide a device that is relatively inexpensive, has high data storage capabilities, and low power consumption. The transistor 12 has its gate 14 coupled a word line connection 16 of an array of the device. Either a source 18 or drain 20 of the transistor 12 is coupled to a sense amplifier via a bitline connection $V_{BIT}$, depending upon the voltage level of the connection $V_{BIT}$. The remaining one of the source 18 and drain 20 is connected to a data access capacitor 22, which is coupled to a reference voltage source $V_{REF}$.

In the prior art memory cell 10, data is read into and written out of the access capacitor 22, by first activating the word line connection 16 to activate the transistor 12. The $V_{BIT}$ connection is then activated for reading data into and writing data out of the access capacitor 22. Data is stored in the data access capacitor 22 as long as power is supplied to the device and as long as the data is refreshed, as is well known in the art.

Figure 3:
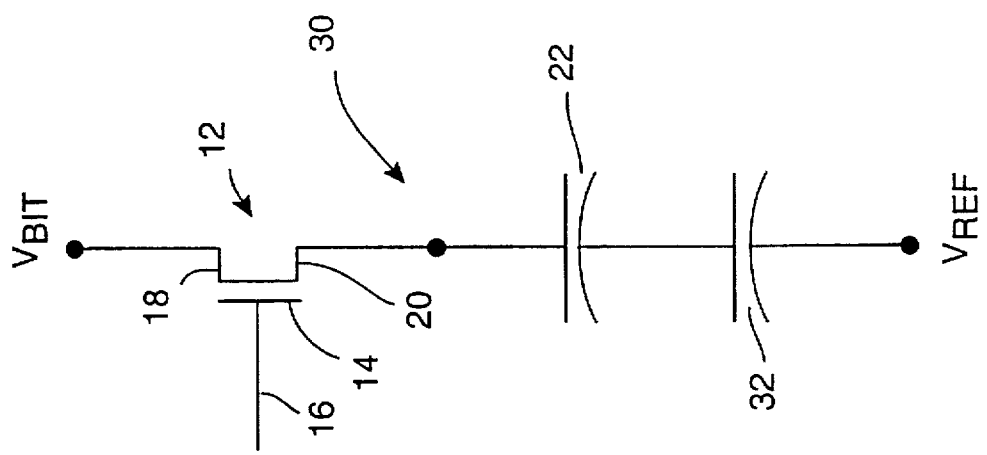
FIG. 3 is a schematic view showing the equivalent capacitance of the memory cell of the nonvolatile random access memory device of the present invention.
Figure 2:
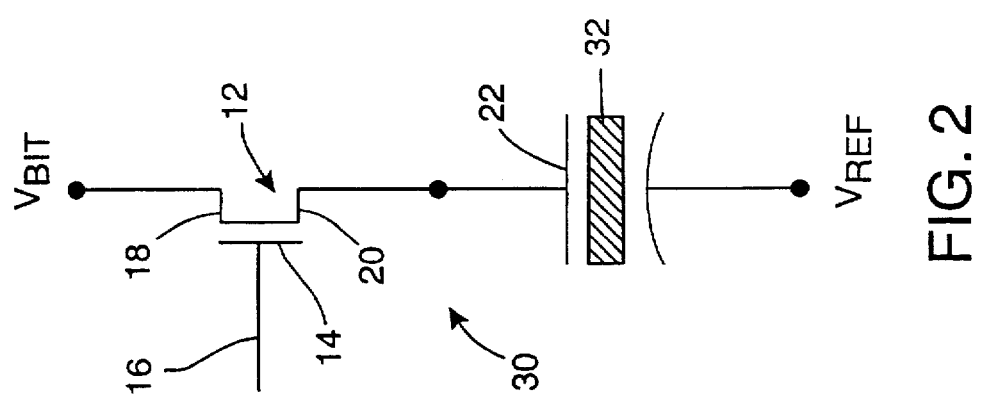
FIG. 2 is a schematic view showing a memory cell of a preferred embodiment of a nonvolatile random access memory device of the present invention.

Referring now to FIG. 2 and FIG. 3 of the drawings, there is schematically shown, generally at 30, a preferred embodiment of a nonvolatile memory cell for a random access memory device, such as a DRAM device. The memory cell 30 of the present invention is preferably integrated into a DRAM device of conventional configuration and operation, so as to facilitate direct substitution of the improved nonvolatile DRAM device of the present invention, for prior art DRAM devices. Additionally, nonvolatile random access memory devices utilizing the memory cells of the present invention, may be used in a number of different applications where data nonvolatility combined with fast data access speeds are desirous features.

In the preferred embodiment, the invented nonvolatile random access memory cell 30 comprises the select transistor 12 having its gate 14 coupled the word line connection 16 of the device. Either the source 18 or drain 20 of the transistor 12 is coupled to a sense amplifier of the memory cell array containing the cell 30, via the bitline connection $V_{BIT}$, depending upon the voltage level of $V_{BIT}$. The remaining one of the source 18 and drain 20 is connected to the data access capacitor 22.

Referring particularly to FIG. 3, schematically, the invented memory cell 30 comprises the data access capacitor 22 coupled in series to a nonvolatile data storage capacitor 32 that is coupled to the reference voltage source $V_{REF}$. As shown in FIG. 2, materially, the nonvolatile data storage capacitor 32 comprises a floating portion of polysilicon (to be thoroughly discussed hereinafter) that is positioned adjacent to the access capacitor 22. Data that is stored in the access capacitor 22 is transferred to the storage capacitor 32, to convert the data from a volatile state to a nonvolatile state.

Figure 4:
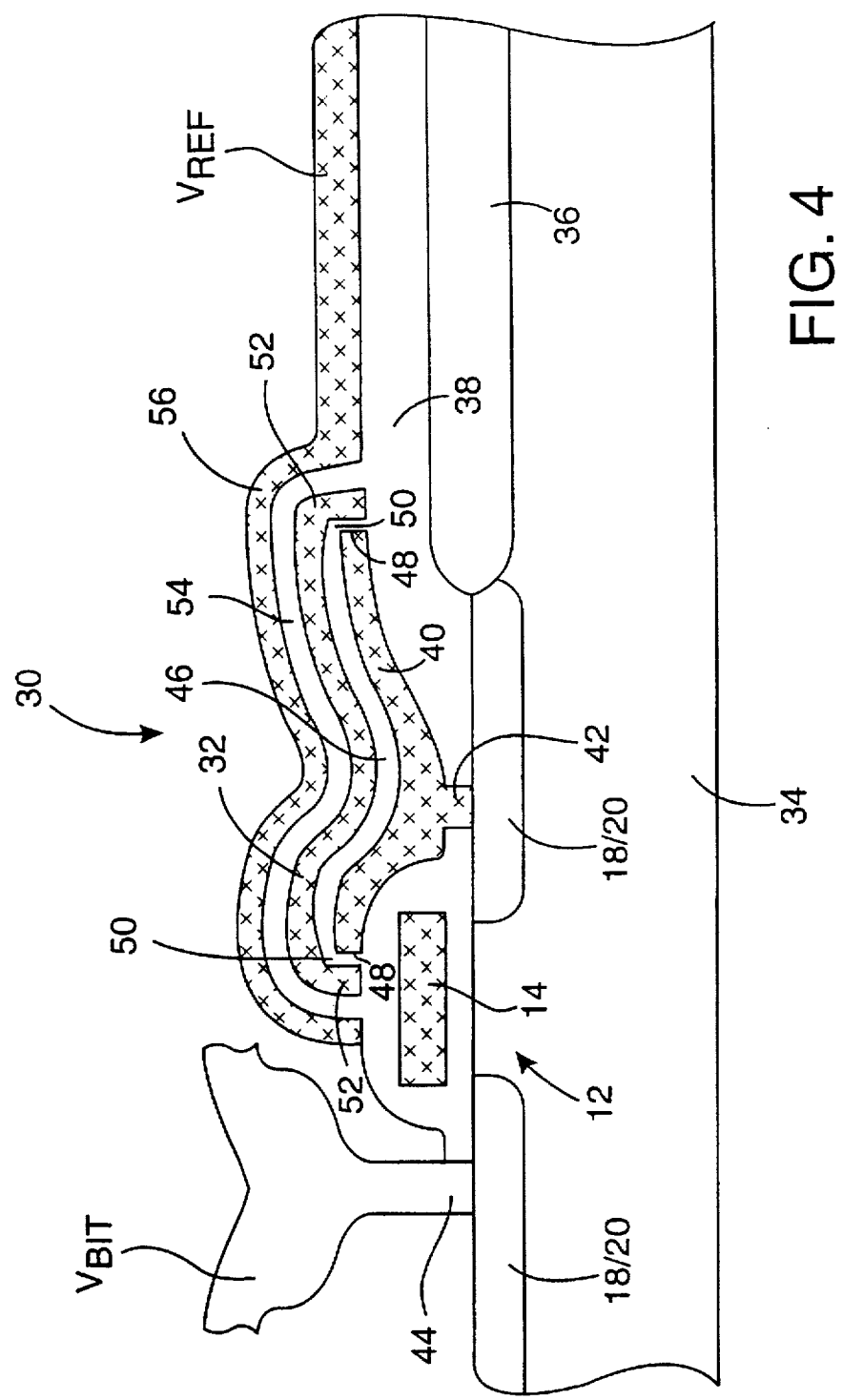
FIG. 4 is a cross sectional view showing the memory cell of the preferred embodiment of the present invention.

Referring now to FIG. 4 of the drawings, there is shown a cross sectional view of the memory cell 30 of the preferred embodiment of the present invention. The memory cell 30 is formed on a silicon substrate 34 as is well known in the art. Field oxide regions 36 are grown on the substrate 34 to define the transistor 12 therebetween. The gate region 14 is formed on the substrate 34 as is known. A pair of diffusion regions that provide the combined source/drain regions 18/20 are formed by implanting impurity ions into the substrate 34 using known techniques. An oxide 38 is then disposed over the substrate 34. A node polysilicon layer 40 is then formed over the oxide 38. The node polysilicon 40 has a curvilinear configuration with a portion 42 thereof extending through the oxide 38 and contacting a source/drain region 18/20. The node polysilicon 40 functions as the data access capacitor 22, which temporarily retains a charge of electrons indicative of data thereon for facile access of the data as is known with prior art DRAM devices.

A portion 44 of a conductive material is disposed adjacent to the gate 14 and contacting the other source/drain region 18/20 for coupling the transistor 12 to the bitline connection $V_{BIT}$ of the device. The bitline connection $V_{BIT}$ is activated for accessing data on the node polysilicon 40.

A tunneling oxide 46 is disposed over the node polysilicon 40. The tunneling oxide 46 is etched, using known methods, above ends 48 of the node polysilicon 40, so that the oxide 46 is ultra thin to provide tunneling regions 50 therethrough. Preferably, the tunneling regions 50 of the oxide 46 range in thickness from approximately 70 Å to 100 Å (Angstroms).

The floating layer of polysilicon 32 is formed over the tunneling oxide 46 and extends adjacently to the node polysilicon 40. The floating polysilicon 32 has end portions 52 that extend partially about the ends 48 of the node polysilicon 40. The end portions 52 of the floating polysilicon 32 and ends 48 of the node polysilicon 40 are configured to facilitate electron transfer through the tunneling regions 50 therebetween. A charge of electrons are transferred between the node polysilicon 40 and floating polysilicon 32, using such methods as Fowler-Nordheim tunneling or hot electron injection, for example. The floating polysilicon layer 32 provides a nonvolatile data storage capacitor for retaining a charge of electrons, indicative of data thereon, after power to the device is removed.

Referring still to FIG. 4 of the drawings, an insulating oxide 54 is disposed over the floating polysilicon 32. The insulating oxide 54 is provided to inhibit leakage of a charge of electrons stored on the floating polysilicon 32 to a plate polysilicon layer 56, for retaining the data on the floating polysilicon 32. The insulating oxide 54 preferably comprises an oxide-nitride-oxide compound and is substantially thick, to aid with retaining the charge of electrons on the floating polysilicon 32.

The plate layer of polysilicon 56 provides the reference voltage source $V_{REF}$. The plate polysilicon 56 is formed over the insulating oxide 54 and extends adjacently to the floating polysilicon 32 and terminates above the transistor's gate 14.

Referring now to FIGS. 2–4 of the drawings, in use a supply voltage of approximately 5 volts DC, is applied to a device, such as a DRAM device, embodying the invented memory cells 30 for activating the device. To read or write data, the word line 16 of a memory cell 30 is activated, for activating its transistor 12. Data can then be stored onto and read from the node polysilicon 40 (or data access capacitor 22), as is well known in the art. Data that is stored on the node polysilicon 40 is in the volatile state, since when the device is deactivated, any charge on the node polysilicon 40 dissipates and the data is lost.

If it is desired to convert the data from the volatile state to a nonvolatile state, a programming procedure is used to transfer the data from the node polysilicon 40 to the floating polysilicon 32, to convert the data to the nonvolatile state. The programming procedure comprises first activating the word line 16 of a memory cell 30, for activating its transistor 12. The bitline connection $V_{BIT}$ is then sensed for determining an initial voltage level thereon. The initial voltage level on $V_{BIT}$ indicates if data is stored on the node polysilicon 40.

A high voltage potential of less than 20 volts DC, and preferably ranging from approximately 10 to 15 volts DC, is then applied to the plate polysilicon 56 or $V_{REF}$, to induce electron tunneling from the node polysilicon 40 to the floating polysilicon 32, through the tunneling regions 50. Known methods, such as Fowler-Nordheim electron tunneling or hot electron injection, may be used to facilitate the electrons tunneling from the node polysilicon 40 to the floating polysilicon 32. The voltage level used in the present invention is sufficient to cause electron tunneling between the node polysilicon 40 and the floating polysilicon 32, without causing stress to the device embodying the invented memory cells 30. Once any electrons stored on the node polysilicon 40 have tunneled to the floating polysilicon 32 and are stored thereon, the data is considered to be in the nonvolatile state. After the data is in the nonvolatile state, power can be removed from the device without loss of the data.

If the initial voltage level on the bitline connection $V_{BIT}$ is substantially zero volts, then electron tunneling occurs from the node polysilicon 40 to the floating polysilicon 32 for storing data thereon and convert the data from the volatile state to the nonvolatile state. Alternatively, if the initial voltage level on the bitline connection $V_{BIT}$ is substantially equivalent to the supply voltage level, then electron tunneling does not from the node polysilicon 40 to the floating polysilicon 32 and a charge is not stored on the floating polysilicon 32, and the data is converted from the volatile state to the nonvolatile state.

After any data is converted to the nonvolatile state, the high voltage potential is removed from the plate polysilicon 56. The word line 16 of the memory cell 30 is deactivated for deactivating the transistor 12 thereof. The supply voltage is then removed from the device, to deactivate the device. Wherein, the data on the node polysilicon 40 is stored on the floating polysilicon 32, with the data being retained after deactivation of the device for providing nonvolatile data storage. The device is now portable, so that a DRAM device embodying the invented memory cells 30 may be removed from a circuit board, transported to a second circuit board, for example, coupled to the second circuit board and reactivated to read the data therefrom.

Referring still to FIGS. 2–4, if it is desired to read data nonvolatile data from the device, the data should first be converted to the volatile state, or stored on the node polysilicon 40. The data is converted, or restored, to the volatile state by first reapplying the supply voltage to the device for activation thereof. The word line 16 of a memory cell 30 is then activated for electronically grounding the node polysilicon 40 and the gate 14 of the transistor 12. The word line 16 is then deactivated. A high negative voltage potential, preferably ranging from approximately −10 to −15 volts DC, is then applied to the plate polysilicon 56. The negative voltage potential induces electrons, indicative of data, stored on the floating polysilicon 32 to tunnel to the node polysilicon 40 to store the data thereon, for restoring the data to the volatile state. The high voltage potential is then removed from the plate polysilicon 56 to complete the data restore procedure. Thus, facile access to the data now provided for accessing data with methods and speeds known to prior art DRAM devices.

Thus, there has been described a nonvolatile memory cell for a random access memory device. The invented memory cells are similar in configuration to the memory cells of known DRAM devices, so that DRAM devices embodying the invented memory cells may replace existing DRAM devices. The floating polysilicon provides nonvolatile storage of data previously stored on the node polysilicon. The voltage level used in the programming and restore procedures of the present invention is sufficient to cause electron tunneling between the node polysilicon and the floating polysilicon, without causing stress to devices embodying the invented memory cells. With the invented memory cells, data is accessed and manipulated substantially faster than known nonvolatile memory devices. Therefore, nonvolatile random access memory devices utilizing the memory cells of the present invention, may be used in a number of different applications where data nonvolatility combined with fast data access speeds are desirous features.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A nonvolatile semiconductor memory cell for a random access memory device, the memory cell comprising:

a transistor having gate, source, and drain regions, the gate coupled to a word line input and one of the source and drain coupled to a bitline input;

a data access capacitor for temporary data storage, the data access capacitor coupled to a reference voltage source and to a remaining one of the source and drain of the transistor;

a data storage capacitor coupled to the data access capacitor and to the reference voltage source, the data storage capacitor retaining a charge of electrons thereon after power supplied to the device is removed to provide nonvolatile data storage; and a tunneling oxide interposed between the data access capacitor and the data storage capacitor for enhancing the ability of the data storage capacitor to retain data thereon, the data access and data storage capacitors configured to facilitate the tunneling of electrons therebetween for converting data between volatile and nonvolatile states.

2. In a nonvolatile random access memory semiconductor device having memory cells comprising a transistor having a gate coupled to a word line input, a selected one of its source and drain coupled to a bitline input, a data access capacitor coupled to a reference voltage source and to the remaining one of the source and drain of the transistor, and a nonvolatile data storage capacitor coupled to the data access capacitor and reference voltage source, a method for converting data between volatile and nonvolatile states, the method comprising the steps of:

(a) applying a supply voltage to the device for activating the device;

(b) activating the word line input of a memory cell for activating the transistor thereof;

(c) sensing the bitline for determining an initial voltage level thereon;

(d) applying a high voltage potential to the reference voltage source for inducing electrons present on the data access capacitor to tunnel from the data access capacitor to the storage capacitor;

(e) if it is determined in step (c) that the initial voltage level on the bitline input is substantially zero volts, then electron tunneling occurs from the data access capacitor to the storage capacitor for storing a charge indicative of data on the storage capacitor to convert the data from a volatile state to a nonvolatile state, and if the determined the voltage level on the bitline input is substantially equivalent to the supply voltage level, then electron tunneling does not occur from the access capacitor to the storage capacitor and a charge is not stored thereon;

(f) removing the high voltage potential from the reference voltage source;

(g) deactivating the word line input of the memory cell for deactivating the transistor thereof; and (h) removing the supply voltage from the device to deactivate the device, wherein if a charge indicative of data, is stored on the storage capacitor, the data thereon is retained after deactivation of the device for providing nonvolatile data storage.

3. The method of claim 2 comprising the further steps of:

(i) applying a supply voltage to the device for activating the device;

(j) activating the word line input of the memory cell for electronically grounding the data access capacitor and the gate of the transistor thereof;

(k) deactivating the word line input;

(l) applying a high negative voltage potential to the reference voltage source for inducing a charge of electrons, indicative of data, stored on the storage capacitor, to tunnel from the storage capacitor to the data access capacitor, for restoring the data to the data access capacitor so that data is converted from the nonvolatile state to the volatile state; and (m) removing the high voltage potential from the reference voltage source.

4. The method of claim 2 wherein Fowler-Nordheim electron tunneling is used for electron tunneling between the data access capacitor to the storage capacitor.

5. The method of claim 2 wherein hot electron injection is used for electron tunneling between the data access capacitor to the storage capacitor.

6. A nonvolatile semiconductor memory cell for a random access memory device comprising:

a transistor region formed on a substrate, the transistor having a gate region;

an oxide layer disposed over the transistor region;

a node polysilicon layer formed over the oxide with a portion of the node polysilicon contacting the substrate, the node polysilicon layer providing a data access capacitor for volatile storage of data thereon;

an electrically conductive portion disposed adjacent to the gate and contacting the substrate for providing to a bitline input to the memory cell;

a tunneling oxide layer disposed over the node polysilicon;

a floating polysilicon layer disposed over the tunneling oxide layer and extending along the node polysilicon, the floating polysilicon extending along the node polysilicon such that at least one tunneling region through the tunneling oxide is provided between the floating polysilicon and the node polysilicon, the floating polysilicon providing a nonvolatile data storage capacitor for retaining a charge of electrons, indicative of data, thereon, after power to the device is removed;

an insulating oxide layer disposed over the floating polysilicon layer; and a plate polysilicon layer formed over the insulating oxide layer for providing a reference voltage source, wherein a high voltage potential is applied to the reference voltage source for inducing the tunneling of electrons between the node polysilicon and floating polysilicon for converting data between volatile and nonvolatile states.

7. The memory cell of claim 6 wherein, the floating polysilicon layer having end portions configured complementary to ends of the node polysilicon to provide tunneling regions therebetween to affect the tunneling of electrons through the tunneling oxide, and the layer of tunneling oxide extending between the end portions of the floating polysilicon and ends of the node polysilicon being substantially thin to provide electron tunneling regions through the tunneling oxide.

8. The memory cell of claim 7 wherein Fowler-Nordheim electron tunneling is used for electron tunneling between the node polysilicon and floating polysilicon layer.

9. The memory cell of claim 7 wherein hot electron injection is used for electron tunneling between the node polysilicon and floating polysilicon layer.

10. The memory cell of claim 6 wherein the insulating oxide layer is substantially thick for inhibiting leakage of electrons stored on the floating polysilicon layer to the plate polysilicon layer for retaining substantially an entire charge of electrons on the floating polysilicon layer so that data stored thereon is not lost.

11. In a nonvolatile dynamic random access memory device comprising a plurality of memory cell arrays, each memory cell comprising a transistor region having a gate coupled to a word line input, a diffusion region coupled to a bitline input, a node polysilicon layer contacting another diffusion region, the node polysilicon layer providing a data access capacitor for temporary data storage, a floating polysilicon layer extending along the node polysilicon with a tunneling oxide layer therebetween, the floating polysilicon and node polysilicon configured to facilitate the tunneling of electrons therebetween, the floating polysilicon providing a nonvolatile data storage capacitor for retaining a charge of electrons thereon after power to the device is removed, and a plate polysilicon layer extending above the floating polysilicon with an insulating oxide layer therebetween, a method for converting data between volatile and nonvolatile states comprising the steps of:

(a) applying a supply voltage to the device for activation thereof;

(b) activating the word line input of a memory cell for activating its transistor;

(c) temporarily storing data into and reading data from the node polysilicon;

(d) sensing the bitline input for determining an initial voltage level thereon indicative of data stored on the node polysilicon;

(e) applying a high voltage potential to the plate polysilicon layer for inducing electrons present on the node polysilicon to tunnel from the node polysilicon through the tunneling oxide to the floating polysilicon layer, the floating polysilicon retaining a charge of electrons indicative of the data temporarily stored on the node polysilicon, while power is applied to the device and after power is removed from the device to provide nonvolatile storage of the data;

(f) if it is determined in step (d) that the initial voltage level on the bitline input is substantially zero volts, then electron tunneling occurs from the node polysilicon to the floating polysilicon for storing data thereon to convert the data from a volatile state to a nonvolatile state, and if the initial voltage level on the bitline input is substantially equivalent to the supply voltage level, then electron tunneling does not occur from the node polysilicon to the floating polysilicon and a charge is not stored on the floating polysilicon and the data is converted from the volatile state to the nonvolatile state;

(g) removing the high voltage potential from the plate polysilicon;

(h) deactivating the word line input of the memory cell for deactivating the transistor thereof;

(i) removing the supply voltage from the device to deactivate the device, wherein the data on the node polysilicon is stored on the floating polysilicon with the data being retained after deactivation of the device for providing nonvolatile data storage;

(j) reapplying the supply voltage to the device for activation thereof;

(k) activating the word line input of the memory cell for electronically grounding the node polysilicon and the gate of the transistor;

(l) deactivating the word line input;

(m) applying a high negative voltage potential to the plate polysilicon for inducing electrons, indicative of data, stored on the floating polysilicon, to tunnel from the floating polysilicon to the node polysilicon, for restoring the data to the node polysilicon so that data is converted from the nonvolatile state to the volatile state to provide facile access to the data;

(n) removing the high voltage potential from the plate polysilicon; and (o) accessing the data stored on the node polysilicon for manipulation of the data.

12. The method of claim 11 wherein the high voltage potential is less than approximately 20 volts.

13. The method of claim 12 wherein the high voltage potential ranges from approximately 10 volts to approximately 15 volts.

14. The method of claim 11 wherein Fowler-Nordheim electron tunneling is used for electron tunneling between the node polysilicon and floating polysilicon layer.

15. A nonvolatile semiconductor memory cell for a dynamic random access memory device, the memory cell comprising:

a substrate;

a transistor region defined between adjacent field oxide regions formed on the substrate, the transistor having a gate;

a pair of diffusion regions formed in the transistor region of the substrate with a channel region extending beneath the gate;

a layer of oxide disposed over the substrate and covering the transistor and gate;

a node polysilicon layer disposed over the oxide with a portion thereof extending through the oxide and contacting a diffusion region, the node polysilicon layer providing a data access capacitor for temporarily retaining a charge of electrons indicative of data thereon for facile access of the data;

an electrically conductive portion disposed adjacent to the gate and contacting the other diffusion region for coupling the transistor to a bitline connection of the device, the bitline connection activated for accessing data on the node polysilicon;

a tunneling oxide disposed over the node polysilicon and gate, the tunneling oxide being substantially thin over ends of the node polysilicon;

a floating layer of polysilicon disposed on the tunneling oxide and extending adjacently to the node polysilicon, the floating polysilicon layer having end portions extending partially about the ends of the node polysilicon configured to provide a tunneling region therebetween, the floating polysilicon layer providing a nonvolatile data storage capacitor for retaining a charge of electrons indicative of data thereon, the charge transferred from the node polysilicon to the floating polysilicon, before power to the device is removed;

an insulating oxide disposed over the floating polysilicon, the insulating oxide inhibiting leakage of charge from the floating polysilicon for retaining data thereon; and a plate layer of polysilicon providing a reference voltage source disposed over the insulating oxide, the plate layer of polysilicon extending adjacently to the floating polysilicon and terminating above the gate, wherein a high voltage potential is applied to the plate polysilicon for inducing electrons to tunnel between the node polysilicon and floating polysilicon for converting data between volatile and nonvolatile states.

16. The memory cell of claim 15 wherein the high voltage potential applied to the plate polysilicon for inducing electron tunneling from the node polysilicon to the floating polysilicon ranges from approximately 10 volts to approximately 15 volts.

17. The memory cell of claim 15 wherein the high voltage potential applied to the plate polysilicon for inducing electron tunneling from the floating polysilicon to the node polysilicon ranges from approximately −10 volts to approximately −15 volts.

18. The memory cell of claim 15 wherein the tunneling oxide ranges in thickness from approximately 50 Angstroms to approximately 150 Angstroms.

19. The memory cell of claim 18 wherein the tunneling oxide ranges in thickness from approximately 70 Angstroms to approximately 100 Angstroms, in the tunneling regions between the end portions of the floating polysilicon and ends of the node polysilicon.

20. The memory cell of claim 15 wherein the insulating oxide is substantially thick and comprises an oxide-nitride-oxide compound.

* * * * *